United States Patent
Yoo et al.

(10) Patent No.: US 11,152,437 B2
(45) Date of Patent: Oct. 19, 2021

(54) DISPLAY APPARATUS HAVING SELF-ALIGNED STRUCTURES AND METHOD OF MANUFACTURING THE SAME

(71) Applicant: SAMSUNG DISPLAY CO., LTD., Yongin-si (KR)

(72) Inventors: In Kyung Yoo, Yongin-si (KR); Donghyun Yang, Yongin-si (KR); SungBae Ju, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 76 days.

(21) Appl. No.: 16/420,930

(22) Filed: May 23, 2019

(65) Prior Publication Data
US 2020/0027935 A1 Jan. 23, 2020

(30) Foreign Application Priority Data
Jul. 19, 2018 (KR) .......................... 10-2018-0083994

(51) Int. Cl.
*H01L 27/32* (2006.01)
*H01L 51/52* (2006.01)

(52) U.S. Cl.
CPC ...... *H01L 27/3246* (2013.01); *H01L 27/3258* (2013.01); *H01L 51/5209* (2013.01); *H01L 51/5218* (2013.01); *H01L 2227/323* (2013.01)

(58) Field of Classification Search
CPC . H01L 51/56; H01L 51/5218; H01L 51/5209; H01L 27/3246; H01L 2227/323; H01L 51/0018; H01L 27/3258
See application file for complete search history.

(56) References Cited

U.S. PATENT DOCUMENTS

| | | | |
|---|---|---|---|
| 2016/0315125 A1* | 10/2016 | Kikuchi | H01L 27/322 |
| 2018/0011404 A1* | 1/2018 | Hashimoto | G03F 7/0233 |
| 2018/0033836 A1* | 2/2018 | Lee | H01L 51/5265 |
| 2019/0027709 A1* | 1/2019 | Zhang | G03F 7/20 |
| 2020/0328362 A1* | 10/2020 | Fan | H01L 51/0097 |

FOREIGN PATENT DOCUMENTS

| | | |
|---|---|---|
| KR | 10-2015-0072581 A | 6/2015 |
| KR | 10-2016-0085986 A | 7/2016 |

* cited by examiner

*Primary Examiner* — Daniel Luke
(74) *Attorney, Agent, or Firm* — Kile Park Reed & Houtteman PLLC

(57) ABSTRACT

A display apparatus includes a base substrate, a thin film transistor layer on the base substrate, an insulation layer on the thin film transistor layer, a first electrode on the insulation layer and in a light emitting area, a pixel defining layer having an opening that has a size and a shape substantially same as that of the first electrode, and on the insulation layer, a light emitting layer on the first electrode, and a second electrode on the light emitting layer.

13 Claims, 10 Drawing Sheets

DISPLAY APPARATUS HAVING SELF-ALIGNED STRUCTURES AND METHOD OF MANUFACTURING THE SAME

CROSS-REFERENCE TO RELATED APPLICATION

Korean Patent Application No. 10-2018-0083994, filed on Jul. 19, 2018, in the Korean Intellectual Property Office, and entitled: "Display Apparatus and Method of Manufacturing the Same," is incorporated by reference herein in its entirety.

BACKGROUND

1. Field

Embodiments relate to a display apparatus and a method of manufacturing the display apparatus.

2. Description of the Related Art

Recently, a display apparatus having light weight and small size has been manufactured. A cathode ray tube (CRT) display apparatus has been used due to a performance and a competitive price. However the CRT display apparatus has a weakness with a size or portability. Therefore a display apparatus such as a plasma display apparatus, a liquid crystal display apparatus and an organic light emitting display apparatus has been highly regarded due to small size, light weight and low-power-consumption.

SUMMARY

Embodiments are directed to a display apparatus, including a base substrate, a thin film transistor layer on the base substrate, an insulation layer on the thin film transistor layer, a first electrode on the insulation layer and in a light emitting area, a pixel defining layer having an opening that has a size and a shape substantially same as that of the first electrode, and on the insulation layer, a light emitting layer on the first electrode, and a second electrode on the light emitting layer.

The first electrode may be in the opening of the pixel defining layer.

A side surface of the first electrode in a thickness direction may make contact with a side surface of the pixel defining layer.

A light reflectance of the first electrode in a wavelength range of 300 nm to 500 nm may be higher than that of the pixel defining layer and that of the insulation layer.

A light transmittance of the insulation layer in a wavelength range of 300 nm to 500 nm may be lower than that of the pixel defining layer.

The pixel defining layer may have a first height, and the display apparatus may further include a spacer having a same material as the pixel defining layer and having a second height larger than the first height.

Embodiments are also directed to a method of manufacturing a display apparatus, the method including forming a thin film transistor layer on a base substrate, forming an insulation layer on the thin film transistor layer, forming a first electrode on the insulation layer, forming a photoresist layer on the insulation layer on which the first electrode is formed, exposing the photoresist layer, and forming a pixel defining layer having an opening by developing the exposed photoresist layer. The opening may have a same size and shape as the first electrode, and the first electrode may be in the opening.

In exposing the photoresist layer, a same light may be irradiated to the photoresist layer in a light emitting area and a non-emitting area adjacent to the light emitting area.

In exposing the photoresist layer, a light reflectance of the first electrode at a wavelength in a range of 300 nm to 500 nm may be higher than that of the photoresist layer and the insulating layer.

In exposing the photoresist layer, a light transmittance of the insulation layer in a wavelength range of 300 nm to 500 nm may be lower than that of the photoresist layer.

Exposing the photoresist layer may include locating a metal mesh mask on the photoresist layer, wherein the metal mesh mask may have a plurality of openings formed uniformly with respect to a light emitting area and a non-emitting area adjacent to the light emitting area, and exposing the photoresist layer by irradiating light through the metal mesh mask.

In exposing the photoresist layer, a light reflectance of the first electrode in a wavelength range of 300 nm to 500 nm may be higher than that of the photoresist layer and that of the insulation layer.

In exposing the photoresist layer, a light transmittance of the insulation layer in a wavelength range of 300 nm to 500 nm may be lower than that of the photoresist layer.

A portion of the metal mesh mask in the non-emitting area may be closed to block light for forming a spacer.

The metal mesh mask may be on the photoresist layer so as to be in contact with an upper surface of the photoresist layer.

A side surface of the first electrode in a thickness direction may make contact with a side surface of the pixel defining layer.

The photoresist layer may include a positive type photoresist composition.

The insulation layer may include a colored polymeric material.

The method may further include forming a light emitting layer on the first electrode after the pixel defining layer is formed, and forming a second electrode on the light emitting layer.

Embodiments are also directed to a method of manufacturing a display apparatus, the method including forming a thin film transistor layer on the base substrate, forming an insulation layer on the thin film transistor layer, forming a first electrode on the insulation layer, forming a photoresist layer on the insulation layer on which the first electrode is formed, exposing the photoresist layer using a light reflection on the first electrode, and forming a pixel defining layer having an opening by developing the exposed photoresist layer, wherein the opening has the same size and shape as the first electrode, and the first electrode is in the opening.

BRIEF DESCRIPTION OF THE DRAWINGS

Features will become apparent to those of skill in the art by describing in detail example embodiments with reference to the attached drawings in which.

DETAILED DESCRIPTION

Figure 1:
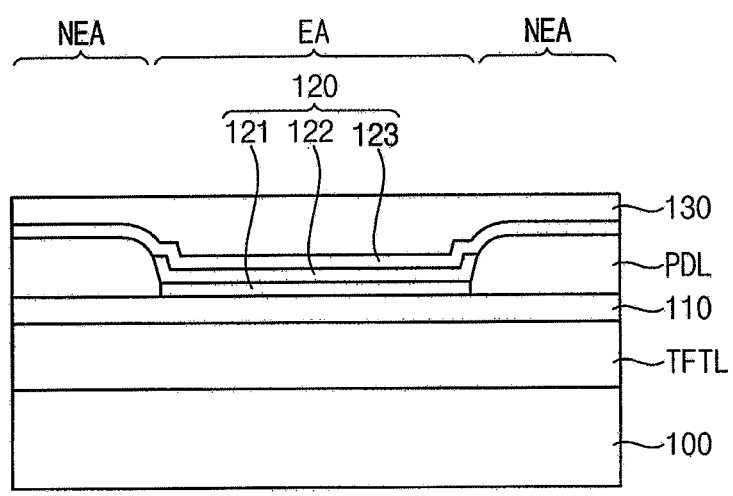
FIG. 1 illustrates a cross-sectional view of a display apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

FIG. 1 is a cross-sectional view illustrating a display apparatus according to an example embodiment.

Referring to FIG. 1, the display apparatus may include a base substrate 100, a thin film transistor TFTL, an insulation layer 110, a pixel defining layer PDL, a light emitting structure 120, and a sealing member 130.

The base substrate 100 may include a transparent insulating substrate. For example, the base substrate 100 may be a transparent resin substrate having flexibility. The transparent resin substrate may include a polyimide-based resin, an acryl-based resin, a polyacrylate-based resin, a polycarbonate-based resin, a polyether-based resin, a sulfonic acid-based resin, a polyethyleneterephthalate-based resin, and the like. For example, the base substrate 100 may be a polyimide (PI) resin film.

The thin film transistor TFTL may be on the base substrate 100. The thin film transistor TFTL may include an active layer, a plurality of wiring layers, a plurality of insulation layers, and a thin film transistor electrically connected to the first electrode 121. Thus, circuits for driving pixels of the display apparatus may be in the thin film transistor TFTL. The thin film transistor TFTL may have a variety of structures. Metal wirings constituting the thin film transistor TFTL may be formed using a low reflection metal, i.e., a metal having low reflectivity.

The insulation layer 110 may be on the thin film transistor TFTL. The insulation layer 110 may include organic insulation material, may have a substantially flat top surface while sufficiently covering structures of the thin film transistor layer TFT. For example, the insulation layer 110 may include an organic material such as polyimide, epoxy resin, acrylic resin, polyester.

The insulation layer 110 may include a colored polymeric material. In an example embodiment, the insulation layer 110 may include a non-photosensitive polymeric material in which a colored material is dispersed or combined. For example, the non-photosensitive polymeric material may include a back-bone structure of novolac, polystyrene, polyhydroxystyrene (PHS), polyacrylate, polymethacrylate, polyvinyl ester, polyvinyl ether, polyolefin, polynorbornene, polyester, polyamide, polycarbonate, etc. A functional group having a reactivity in an exposure process (e.g., a protecting group or a leaving group) may not be included in the back-bone structure.

The colored material contained in the insulation layer 110 may include a black material such as carbon black, or a light-absorbing dye material. In an example embodiment, the dye material may have an absorbance to a light having a wavelength in a range from about 300 nm to about 500 nm.

The light emitting structure 120 may include a first electrode 121, a light emitting layer 122 and a second electrode 123.

The first electrode 121 may be on the insulation layer 110. The first electrode 121 may be a reflective electrode that includes a reflective material. For example, the first electrode 121 may be formed using aluminum, alloy containing aluminum, aluminum nitride, silver, alloy containing silver, tungsten, tungsten nitride, copper, alloy containing copper, nickel, alloy containing nickel, chromium, chromium nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the first electrode 121 may have a single layer structure or a multi layer structure, which may include a metal film, an alloy film, a metal nitride film, a conductive metal oxide film and/or a transparent conductive film. For example, the first electrode 121 may have ITO/Ag/ITO structure.

The pixel defining layer PDL may be on the insulation layer 110 on which the first electrode 121 is disposed. The pixel defining layer PDL may be formed using an organic material. For example, the pixel defining layer PDL may include photoresist, acryl-based resin, polyimide-based resin, polyamide-based resin, siloxane-based resin, etc. The pixel defining layer PDL may include a positive type photoresist composition.

The positive type photoresist composition generally refers to a photoresist in which a portion except an exposed portion remains as a pattern after exposure. The positive type photoresist composition is exposed to light, and the exposed portion is chemically decomposed and washed out after development.

The pixel defining layer PDL may form an opening for exposing the first electrode 121. The opening may have the same size and shape as the first electrode 121. Thus, the first electrode 121 may be in the opening of the pixel defining layer PDL, and a side surface in a thickness direction of the first electrode 121 may be in contact with a side surface of the pixel defining layer.

A light emitting area EA and a non-emitting area NEA of the display apparatus may be defined by the opening of the pixel defining layer PDL. For example, a portion of the pixel defining layer PDL where the opening is located may correspond to the light emitting area, and the non-emitting area may correspond to a portion of the pixel defining layer PDL adjacent to the opening. The size and the shape of the opening may match the size and shape of the first electrode 121. Thus, the light emitting area EA may substantially coincide with the first electrode 121.

In addition, a light transmittance of the insulation layer 110 in a wavelength range of 300 nm to 500 nm may be lower than that of the pixel defining layer PDL. In this regard, patterning of the pixel defining layer PDL may be performed by a maskless process, an open mask process, or a metal mesh mask process, which will be described in detail below with reference to FIG. 2C.

The light emitting layer 122 may be on the first electrode 121 exposed through the opening of the pixel defining layer PDL. In addition, the light emitting layer 122 may extend on a sidewall of the opening of the pixel defining layer PDL. In some example embodiments, the light emitting layer 122 may include an organic light emitting layer (EL), a hole injection layer (HIL), a hole transfer layer (HTL), an electron transfer layer (ETL), an electron injection layer (EIL), etc. In some example embodiments, except for the organic emission layer, the hole injection layer, the hole transport layer, the electron transport layer, and the electron injection layer may be formed in common to correspond to a plurality of pixels. In some example embodiments, a plurality of organic light emitting layers may be formed using light emitting materials for generating different colors of light such as a red color of light, a green color of light and a blue color of light in accordance with color pixels of the display apparatus. In some example embodiments, the organic light emitting layer of the of the light emitting layer 122 may include a plurality of stacked light emitting materials for generating a red color of light, a green color of light and a blue color of light to thereby emitting a white color of light. Elements of the light emitting layer 122 may be commonly formed so as to correspond to a plurality of pixels, and each pixel may be divided by a color filter layer.

The second electrode 123 may be on the pixel defining layer PDL and the light emitting layer 122. The second electrode 123 may include a transmissive material or a reflective material in accordance with the emission type of the display apparatus. For example, the second electrode 123 may be formed using aluminum, alloy containing aluminum, aluminum nitride, silver, alloy containing silver, tungsten, tungsten nitride, copper, alloy containing copper, nickel, alloy containing nickel, chromium, chromium nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the second electrode 123 may also have a single layer structure or a multi layer structure, which may include a metal film, an alloy film, a metal nitride film, a conductive metal oxide film and/or a transparent conductive film.

The sealing member 130 may be on the second electrode 123. The sealing member 130 may prevent penetration of moisture and oxygen from outside. The sealing member 130 may be a thin film encapsulation layer or a sealing substrate. The thin film encapsulation layer may include at least one inorganic layer, and at least one organic layer. The at least one inorganic layer, and the at least one organic layer may be sequentially stacked. For example, the thin film encapsulation layer may include two inorganic layers and one organic layer therebetween.

According to the present example embodiment, the first electrode of the light emitting structure is not covered or overlapped by the pixel defining layer, Thus, the light emitting area may be enlarged in proportion to a structure in which an edge of the first electrode is covered by the pixel defining layer.

FIGS. 2A to 2E are cross-sectional views illustrating a method of manufacturing the display apparatus of FIG. 1.

Figure 2A:
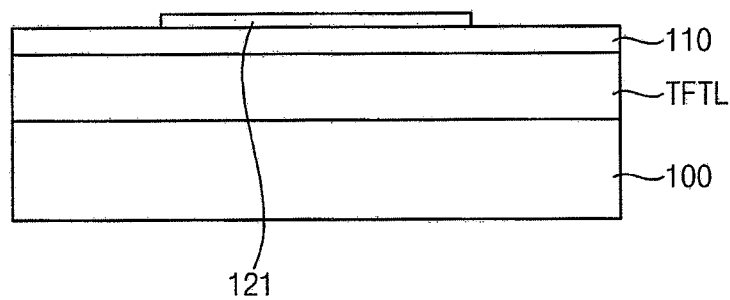
FIGS. 2A to 2E illustrate cross-sectional views of stages in a method of manufacturing the display apparatus of FIG. 1.

Referring to FIG. 2A, a thin film transistor TFTL may be formed on a base substrate 100. An insulation layer 110 may be formed the thin film transistor TFTL. In an example embodiment, the insulation layer 110 may be formed by a spin coating process using an organic polymer material, and may have a substantially flat top surface.

A light transmittance of the insulation layer 110 in a wavelength range of 300 nm to 500 nm may be lower than that of pixel defining layer, as will be explained below. In an example embodiment, the insulation layer 110 may include a colored polymeric material. The colored material contained in the insulation layer 110 may include a black material such as carbon black, or a light-absorbing dye material. In an example embodiment, the dye material may have an absorbance to a light having a wavelength in a range from about 300 nm to about 500 nm.

A first electrode 121 may be formed on the insulation layer 110. In an example embodiment, the first electrode 121 may be obtained by forming a metal layer on the insulation layer 110 and then patterning the metal layer using a photolithography process or an etching process using an additional etching mask.

Figure 2B:
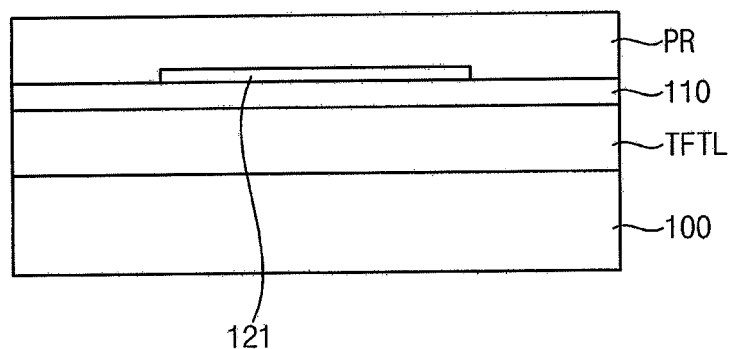

Referring to FIG. 2B, a photoresist layer PR may be formed on the insulation layer. The photoresist layer PR may include a positive type photoresist composition.

In an example embodiment, a photoresist layer PR may be formed by applying a composition including a photoresist polymer on the insulation layer 110 by a spin coating process.

Figure 2C:
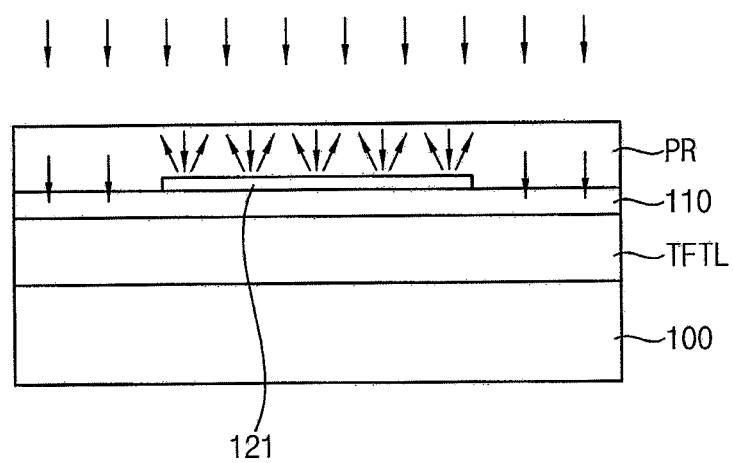

Referring to FIG. 2C, the photoresist layer PR may be exposed by irradiating light (indicated by the upper arrows in FIG. 2C). In an example embodiment, the light may be light having a peak wavelength in a range of 300 nm to 500 nm.

A portion of the photoresist layer PR overlapping with the first electrode 121 may have a larger exposure amount than other portions where is not overlapping with the first electrode 121. In the present example embodiment, the first electrode 121 is a reflective electrode and reflects light. Thus, after the light emitted from an exposing device passes through the portion of the photoresist layer PR on the first electrode 121, the light is again provided to the portion of the photoresist layer PR as a result of the reflection. Accordingly, the portion of the photoresist layer PR that overlaps the first electrode 121 may have a larger amount of exposure than other portions of the photoresist layer PR that do not overlap the first electrode 121.

A light transmittance of the insulation layer 110 in a wavelength range of 300 nm to 500 nm may be lower than that of the photoresist layer PR. Accordingly, reflection by structures of the thin film transistor TFTL under the insulation layer 110 or the insulation layer 110 may be minimized.

Figure 2D:
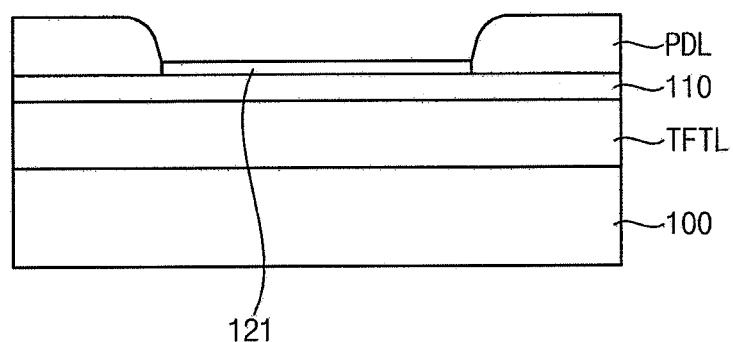

Referring to FIG. 2D, through a development process, the exposed portions of the photoresist layer PR may be removed to form the pixel defining layer PDL. At this time, since the portion of the photoresist layer PR overlapping the first electrode 121 has a relatively large exposure amount, the portion of the photoresist layer PR overlapping the first electrode 121 may be removed by the developing process to form the pixel defining layer PDL with an opening that has the same size and shape as the first electrode 121, with the first electrode 121 located in the opening.

Figure 2E:
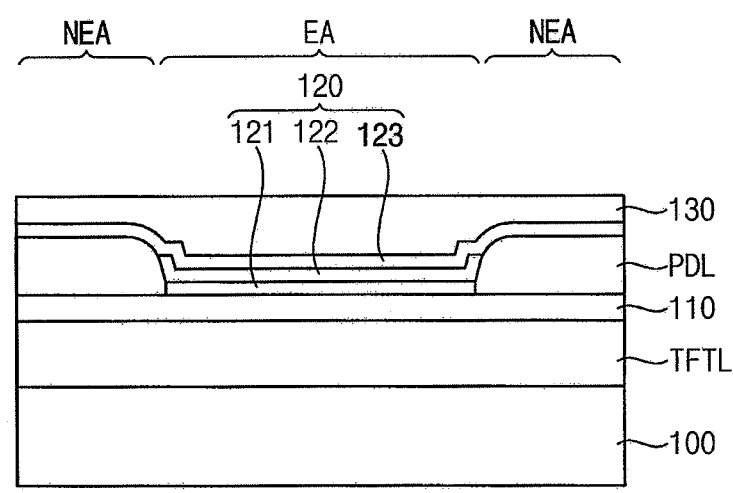

Referring to FIG. 2E, a light emitting layer 122 and a second electrode 123 may be formed on the first electrode 121, and then a sealing member 130 may be formed to manufacture the display apparatus. The light emitting layer 122, the second electrode 123, and the sealing member 130 may be formed by various methods.

FIGS. 3A to 3E are cross-sectional views illustrating another method of manufacturing the display apparatus of FIG. 1. The method is substantially the same as the method of FIGS. 2A to 2E except that metal mesh mask is used in an exposure process. Thus, repeated explanation will be omitted.

Figure 3A:
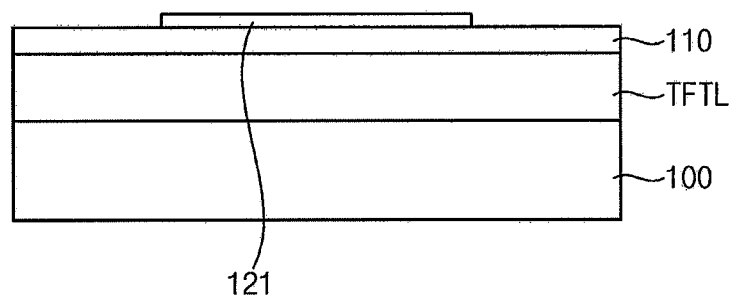
FIGS. 3A to 3E illustrate cross-sectional views of stages in another method of manufacturing the display apparatus of FIG. 1.
Figure 3B:
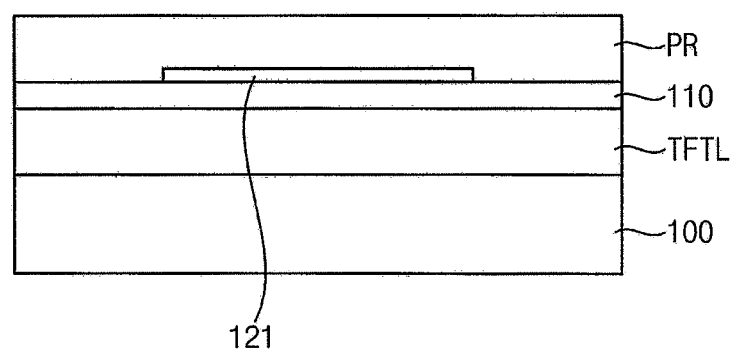

Referring to FIGS. 3A and 3B, a thin film transistor layer TFTL may be formed on a base substrate 100. An insulation layer 110 may be formed on the thin film transistor TFTL. A photoresist layer PR may be formed on the insulation layer 110.

Figure 3C:
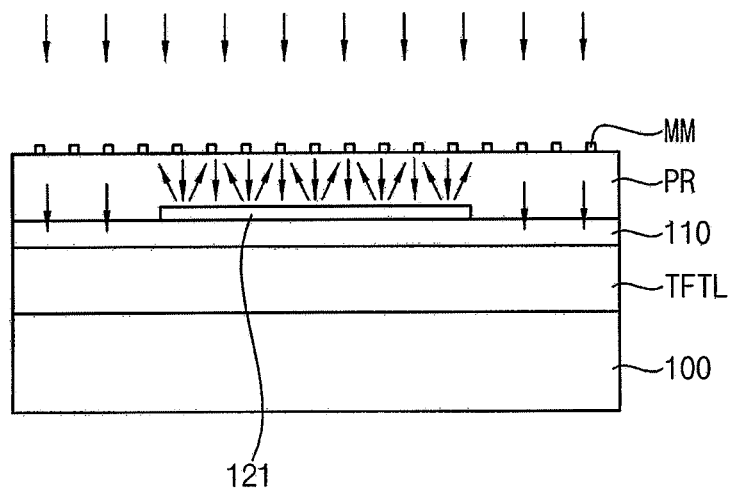

Referring to FIG. 3C, a metal mesh mask MM may be located on the photoresist layer PR. The metal mesh mask MM may be a metal mask in which a plurality of openings are formed uniformly with respect to a light emitting area (refers to EA in FIG. 3E) and a non-emitting area (refers to NEA in FIG. 3E) adjacent to the light emitting area. A lower surface of the metal mesh mask MM facing the photoresist layer PR may have a property of reflecting light.

The metal mesh mask (MM) may be disposed close to an upper surface of the photoresist layer PR. In an example embodiment, the metal mesh mask MM may be arranged to be spaced apart from the photoresist layer PR.

The photoresist layer PR may be exposed by irradiating light through the metal mesh mask MM, as indicated by the upper row of downward facing arrows in FIG. 3C.

A portion of the photoresist layer PR overlapping with the first electrode 121 may have a larger exposure amount than other portions where the photoresist layer PR does not overlap with the first electrode 121. According to the present example embodiment, the first electrode 121 is a reflective electrode and reflects light. Thus, after the light emitted from an exposing device passes through the portion of the photoresist layer PR on the first electrode 121, the reflected light is again provided to the portion of the photoresist layer PR. In addition, the light is again reflected on the lower surface of the metal mesh mask MM on the photoresist layer PR and is again incident on the portion of the photoresist layer PR. Thus, the amount of exposure to the portion of the photoresist layer PR may be further increased.

Figure 3D:
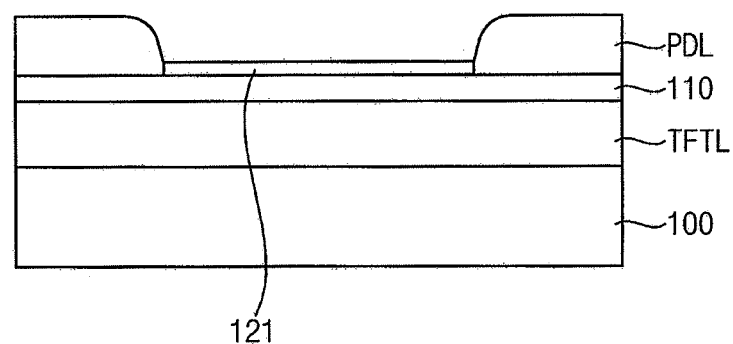

Referring to FIG. 3D, through a development process, the exposed portions of the photoresist layer PR may be removed to form the pixel defining layer PDL. The portion of the photoresist layer PR overlapping the first electrode 121 may have a relatively large exposure amount. Thus, the portion of the photoresist layer PR may be removed by the developing process. Accordingly, the pixel defining layer PDL may be formed to have an opening that has the same size and shape as the first electrode 121, and to locate the first electrode 121 in the opening.

Figure 3E:
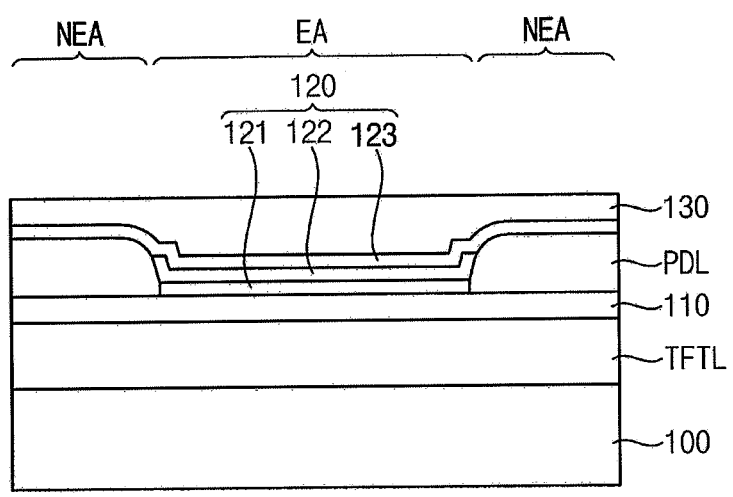

Referring to FIG. 3E, a light emitting layer 122 and a second electrode 123 may be formed on the first electrode 121, and then a sealing member 130 may be formed to manufacture the display apparatus. The light emitting layer 122, the second electrode 123, and the sealing member 130 may be formed by various known methods.

Figure 4:
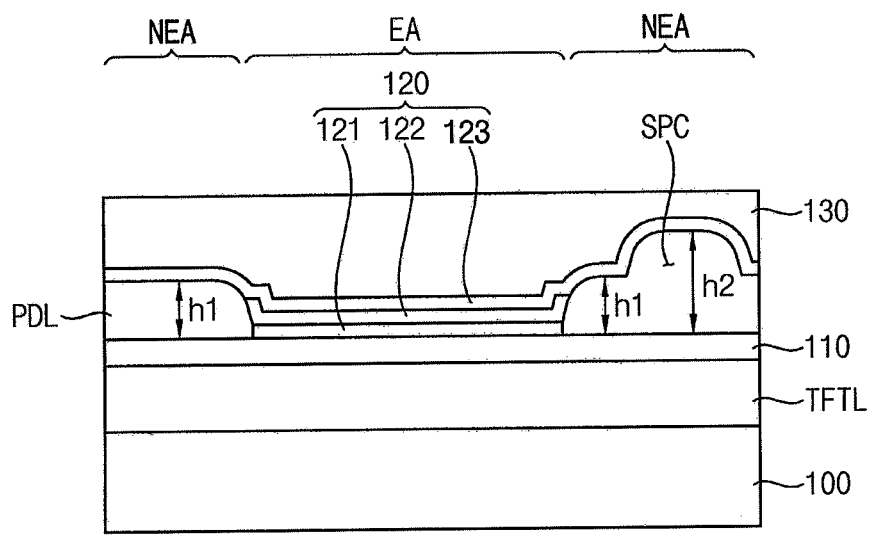
FIG. 4 illustrates a cross-sectional view of a display apparatus according to an example embodiment.

FIG. 4 is a cross-sectional view illustrating a display apparatus according to an example embodiment.

Referring to FIG. 4, the display apparatus may be substantially the same as the display apparatus of FIG. 1, except that a part of the pixel defining layer PDL is formed as a spacer SPC. Therefore, repeated explanation will be omitted.

The display apparatus may include a base substrate 100, a thin film transistor TFTL, a insulation layer 110, a pixel defining layer PDL, a light emitting structure 120, and a sealing member 130.

The pixel defining layer PDL may have a first height h1. A part of the pixel defining layer PDL may be a space SPC that has a second height h2 higher than the first height h1.

FIGS. 5A to 5E are cross-sectional views illustrating a method of manufacturing the display apparatus of FIG. 4.

Figure 5A:
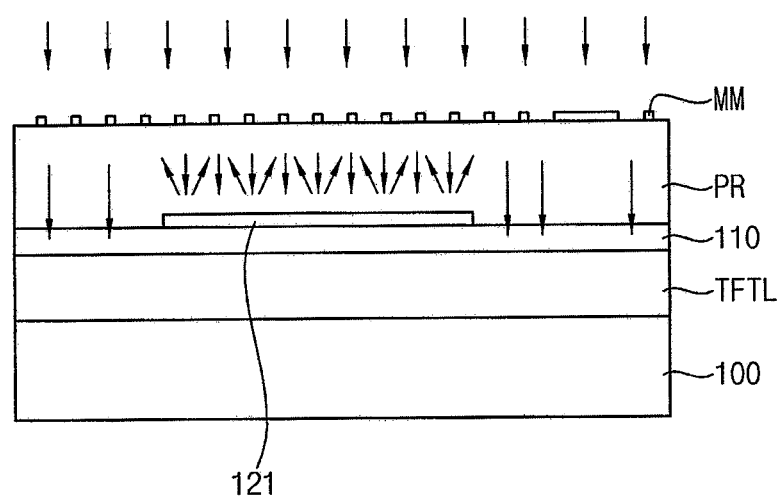
FIGS. 5A to 5C illustrate cross-sectional views of stages in a method of manufacturing the display apparatus of FIG. 4.

Referring to FIG. 5A, a thin film transistor TFTL may be formed on a base substrate 100. An insulation layer 110 may be formed the thin film transistor TFTL. A photoresist layer PR may be formed on the insulation layer 110.

Figure 5B:
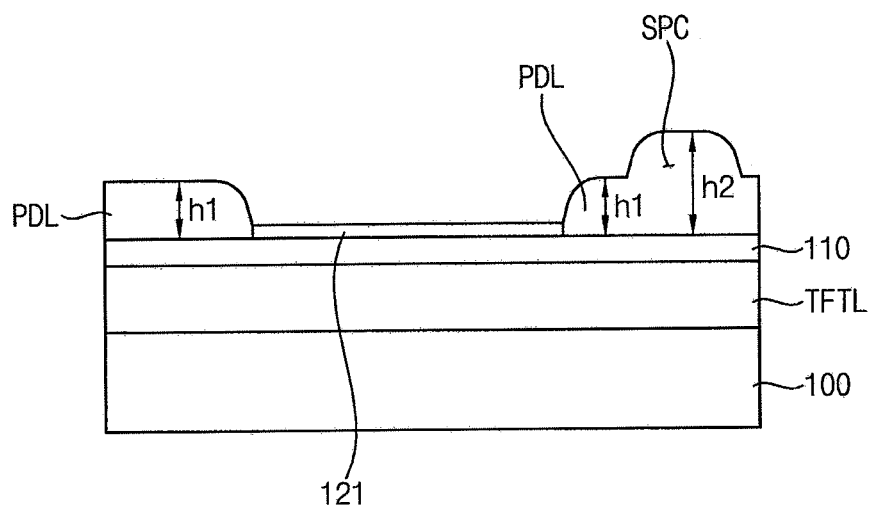

Next, a metal mesh mask MM may be located on the photoresist layer PR. The metal mesh mask MM may be a metal mask in which a plurality of openings are formed uniformly with respect to a light emitting area (refers to EA in FIG. 3E) and a non-emitting area (refers to NEA in FIG. 3E) adjacent to the light emitting area, but wherein a portion of the metal mask corresponding to the spacer (i.e., the closed portion is the portion of the metal mask directly above the region where SPC in FIG. 5B is formed) is closed to block the light. A lower surface of the metal mesh mask MM facing the photoresist layer PR may have a property of reflecting light.

The photoresist layer PR may be exposed by irradiating light through the metal mesh mask MM, as indicated by the upper row of downward facing arrows in FIG. 5A.

A portion of the photoresist layer PR overlapping with the first electrode 121 may have a larger exposure amount than other portions where it is not overlapping with the first electrode 121. In addition, an exposure amount of a portion of the photoresist layer PR where the spacer is to be formed may be lower than an exposure amount of a portion of the photoresist layer PR where the pixel defining layer (refer to PDL in FIG. 5B) is to be formed at the first height.

Referring to FIG. 5B, through a development process, the exposed portions of the photoresist layer PR may be removed to form the pixel defining layer PDL. The portion of the photoresist layer PR overlapping the first electrode 121 may have a relatively large exposure amount such that the portion of the photoresist layer PR may be removed by the developing process. In addition, a portion corresponding to the closed portion of the metal mesh mask MM may have a smaller exposure amount such that the spacer SPC having the second height h2 larger than the first height h1 is formed.

Figure 5C:
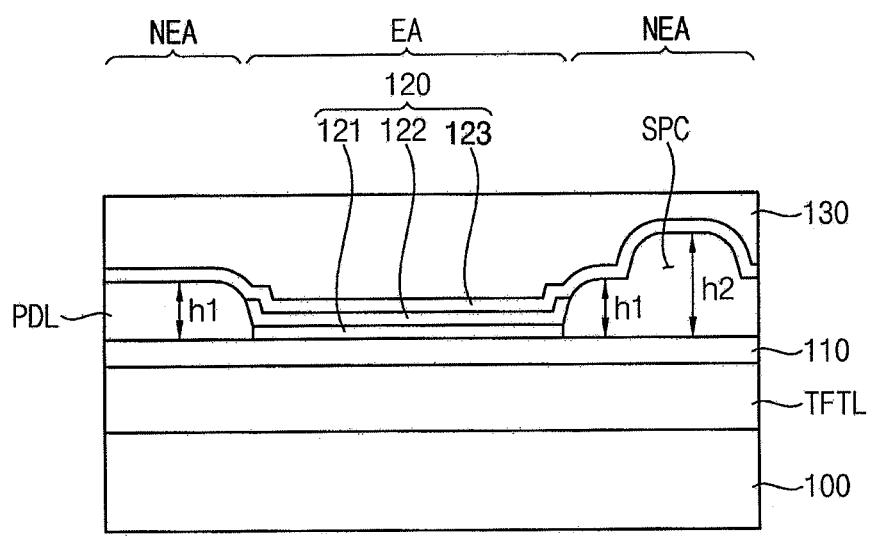

Referring to FIG. 5C, a light emitting layer 122 and a second electrode 123 may be formed on the first electrode 121, and then a sealing member 130 may be formed to manufacture the display apparatus. The light emitting layer 122, the second electrode 123, and the sealing member 130 may be formed by various methods.

As described above, according to embodiments, patterning for forming an opening of a pixel defining layer may be performed in a self-aligning manner using reflection from a first electrode. Thus, an additional mask for patterning the pixel defining layer is unnecessary, and critical dimension (CD) dispersion of the pixel defining layer may be reduced.

Generally, CD dispersion of the process for forming the first electrode is better than CD dispersion of the process of patterning the pixel defining layer through the photo process. According to embodiments, display quality may be improved by reducing a deviation of the opening of the pixel defining layer for each pixel as compared with a process in which the pixel defining layer is formed by exposure and development using an additional mask.

In addition, since there is no overlapping portion between the first electrode and the pixel defining layer, the ratio of the light emitting area to the non-emitting area can be maximized, which may improve the display quality.

Figure 6:
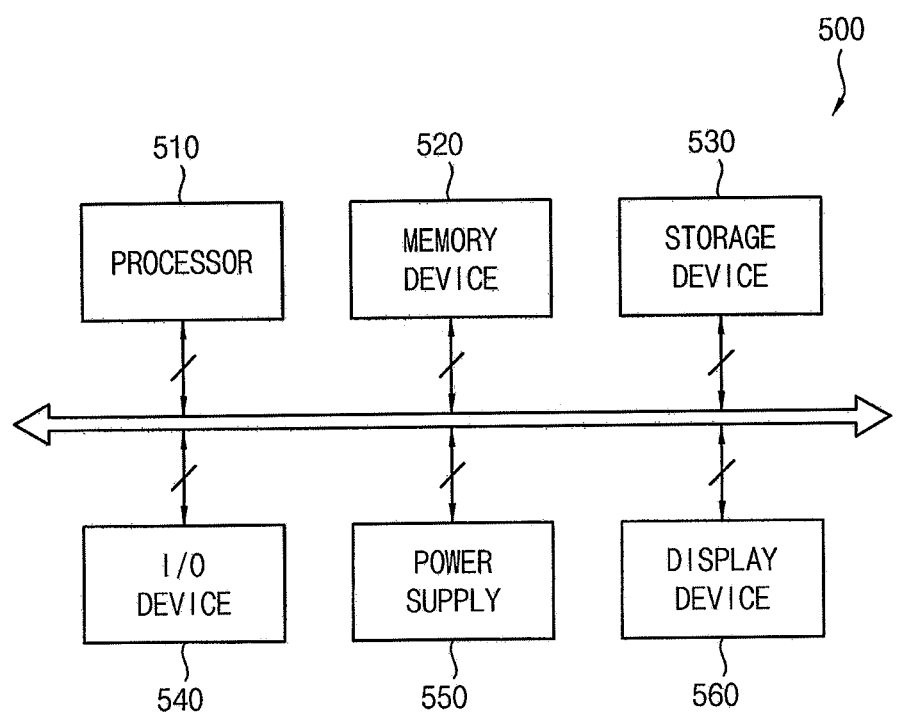
FIG. 6 illustrates a block diagram of an electronic device according to an example embodiment.
Figure 7A:
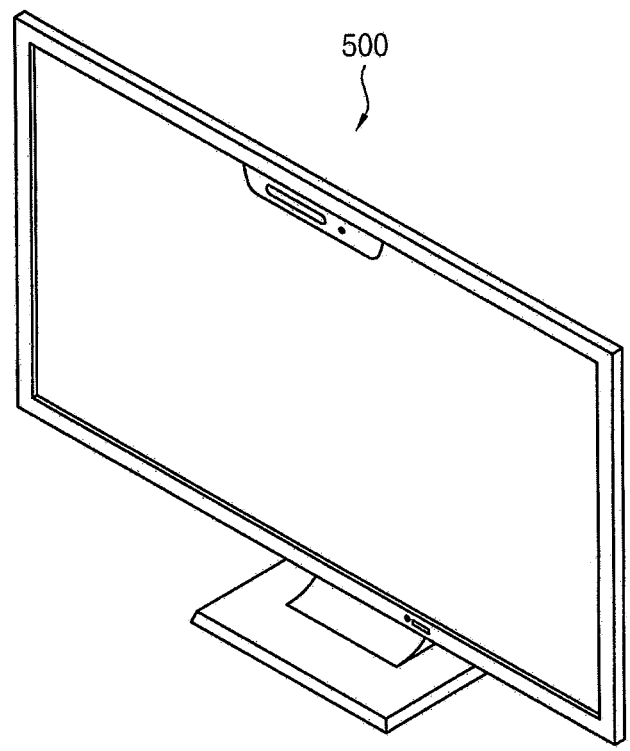
FIG. 7A illustrates a diagram of an example in which the electronic device of FIG. 6 is implemented as a television.
Figure 7B:
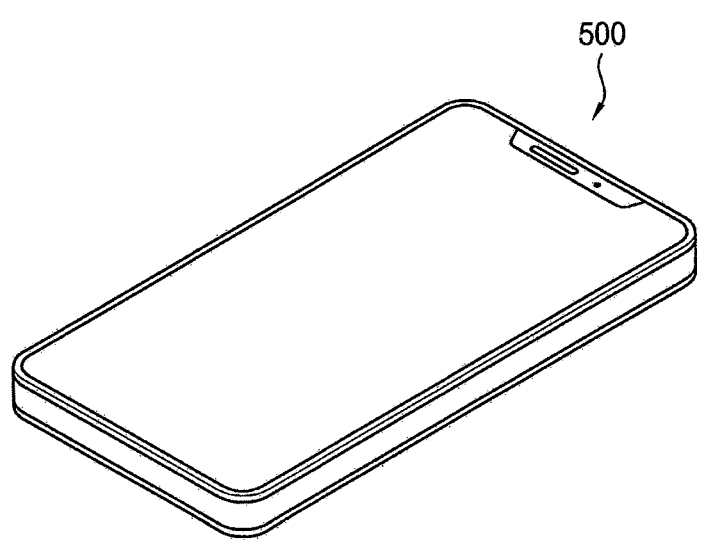
FIG. 7B illustrates a diagram of an example in which the electronic device of FIG. 6 is implemented as a smart phone.

FIG. 6 is a block diagram illustrating an electronic device according to an example embodiment. FIG. 7A is a diagram illustrating an example in which the electronic device of FIG. 6 is implemented as a television. FIG. 7B is a diagram illustrating an example in which the electronic device of FIG. 6 is implemented as a smart phone.

Referring to FIGS. 6 through 7B, the electronic device 500 may include a processor 510, a memory device 520, a storage device 530, an input/output (I/O) device 540, a power supply 550, and a display apparatus 560. The display apparatus 560 may correspond to the display apparatus of FIG. 1. In addition, the electronic device 500 may further include a plurality of ports for communicating with a video card, a sound card, a memory card, a universal serial bus (USB) device, other electronic devices, etc. In an example embodiment, as illustrated in FIG. 12A, the electronic device 500 may be implemented as a television. In another example embodiment, as illustrated in FIG. 12B, the electronic device 500 may be implemented as a smart phone. In another example embodiment, the electronic device 500 may be implemented as a cellular phone, a video phone, a smart pad, a smart watch, a tablet PC, a car navigation system, a computer monitor, a laptop, a head mounted display (HMD), etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc., and an output device such as a printer, a speaker, etc. The power supply 550 may provide power for operations of the electronic device 500.

The display apparatus 560 may be coupled to other components via the buses or other communication links. In some example embodiments, the display apparatus 560 may be included in the I/O device 540. As described above, the display apparatus 560 may reduce a deviation of the opening of the pixel defining layer for each pixel, which may improve the display quality. In an example embodiment, there is no vertically overlapping portion of the pixel defining layer on the first electrode. Thus, the ratio of the light emitting area to the non-emitting area may be maximized, which may improve the display quality.

Embodiments may be applied to an organic light emitting display apparatus and various electronic devices including the same. For example, embodiments may be applied to a mobile phone, a smart phone, a video phone, a smart pad, a smart watch, a tablet PC, a car navigation system, a television, a computer monitor, a notebook, etc.

By way of summation and review, an organic light emitting display apparatus may be manufactured by a method that includes forming a photoresist layer on a substrate, and exposing and patterning the photoresist layer using a mask. If the patterns thus formed deviate according to the mask and positions of respective pixels, display quality may be degraded. Generally, CD dispersion of the process for forming a first electrode may be better than CD dispersion of a process of patterning a pixel defining layer through a photo process.

As described above, patterning for forming the opening of the pixel defining layer may be performed in a self-aligning manner using the first electrode. An additional mask for patterning the pixel defining layer may not be used, and critical dimension (CD) dispersion of the pixel defining layer may be reduced. According to an embodiment, display quality may be improved by reducing a deviation of an opening of the pixel defining layer for each pixel as compared with a process in which the pixel defining layer is formed by exposure and development using an additional mask. In addition, according to an embodiment there is no overlapping portion between the first, electrode and the pixel defining layer. Thus, the ratio of the light emitting area to the non-emitting area may be maximized, which may improve the display quality.

As described above, embodiments relate to a display apparatus that may provide improved display quality and a method of manufacturing the display apparatus. One or more example embodiments may provide a display apparatus in which display quality is improved and manufacturing process is simplified. Embodiments also provide a method of manufacturing the display apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display apparatus, the method comprising:
    forming a thin film transistor layer on a base substrate;
    forming an insulation layer on the thin film transistor layer;
    forming a reflective first electrode on the insulation layer, the first electrode having a planar top surface;
    forming a photoresist layer on the insulation layer on which the first electrode is formed;
    exposing the photoresist layer; and
    forming a pixel defining layer made from the photoresist layer, the pixel defining layer having an opening directly contacting the top surface of the first electrode by developing the exposed photoresist layer, wherein
    exposing the photoresist layer includes irradiating a same light to the photoresist layer both in an area of the opening and in an area immediately outside a boundary of the opening at a top surface of the photoresist layer,
    the opening has a same size and shape as the top surface of the first electrode at the top surface of the first electrode, and
    the entire first electrode is in the opening.

2. The method as claimed in claim 1, wherein, in exposing the photoresist layer, a light reflectance of the first electrode at a wavelength in a range of 300 nm to 500 nm is higher than that of the photoresist layer and the insulating layer.

3. The method as claimed in claim 1, wherein, in exposing the photoresist layer, a light transmittance of the insulation layer in a wavelength range of 300 nm to 500 nm is lower than that of the photoresist layer.

4. The method as claimed in claim 1, wherein exposing the photoresist layer includes:
   locating a metal mesh mask on the photoresist layer, wherein the metal mesh mask has a plurality of openings formed uniformly with respect to a light emitting area and a non-emitting area adjacent to the light emitting area; and
   exposing the photoresist layer by irradiating light through the metal mesh mask.

5. The method as claimed in claim 4, wherein, in exposing the photoresist layer, a light reflectance of the first electrode in a wavelength range of 300 nm to 500 nm is higher than that of the photoresist layer and that of the insulation layer.

6. The method as claimed in claim 4, wherein, in exposing the photoresist layer, a light transmittance of the insulation layer in a wavelength range of 300 nm to 500 nm is lower than that of the photoresist layer.

7. The method as claimed in claim 4, wherein a portion of the metal mesh mask in the non-emitting area is closed to block light for forming a spacer.

8. The method as claimed in claim 4, wherein the metal mesh mask is on the photoresist layer so as to be in contact with an upper surface of the photoresist layer.

9. The method as claimed in claim 1, wherein a side surface of the first electrode in a thickness direction makes contact with a side surface of the pixel defining layer.

10. The method as claimed in claim 1, wherein the photoresist layer includes a positive type photoresist composition.

11. The method as claimed in claim 1, wherein the insulation layer includes a colored polymeric material.

12. The method as claimed in claim 1, further comprising:
   forming a light emitting layer on the first electrode after the pixel defining layer is formed; and
   forming a second electrode on the light emitting layer.

13. A method of manufacturing a display apparatus, the method comprising:
   forming a thin film transistor layer on a base substrate;
   forming an insulation layer on the thin film transistor layer;
   forming a reflective first electrode on the insulation layer, the first electrode having a planar top surface;
   forming a photoresist layer on the insulation layer on which the first electrode is formed;
   exposing the photoresist layer using a light reflection of the first electrode; and
   forming a pixel defining layer made from the photoresist layer, the pixel defining layer having an opening directly contacting the top surface of the first electrode by developing the exposed photoresist layer, wherein
   exposing the photoresist layer includes irradiating a same light to the photoresist layer both in an area of the opening and in an area immediately outside a boundary of the opening at a top surface of the photoresist layer,
   the opening has a same size and shape as the top surface of the first electrode at the top surface of the first electrode, and
   the entire first electrode is in the opening.

* * * * *